United States Patent [19]

Maehara et al.

[11] 4,076,996
[45] Feb. 28, 1978

[54] POWER SUPPLIER FOR MAGNETRON

[75] Inventors: Naoyoshi Maehara, Nara; Hiroshi Fujieda, Kashiwara; Tatsuo Saka, Nara, all of Japan

[73] Assignee: Matsushita Electric Industrial Co., Ltd., Kadoma, Japan

[21] Appl. No.: 721,548

[22] Filed: Sep. 8, 1976

[30] Foreign Application Priority Data

Sep. 12, 1975 Japan .................................. 50-111439
Sep. 16, 1975 Japan .................................. 50-112435
Dec. 23, 1975 Japan .................................. 50-154182

[51] Int. Cl.$^2$ .......................................... H05B 41/36
[52] U.S. Cl. ..................................... 315/106; 315/223; 315/308; 328/67
[58] Field of Search ............... 315/223, 224, 307, 308, 315/127, 106, 107, 105; 328/67; 331/86

[56] References Cited

U.S. PATENT DOCUMENTS 3,134,048  5/1964  Wolfframm et al. .............. 328/67 X Primary Examiner—Eli Lieberman
Assistant Examiner—Charles F. Roberts
Attorney, Agent, or Firm—Wenderoth, Lind & Ponack

[57] ABSTRACT

The present disclosure relates to a power supplier for a magnetron for use in electric appliances, such as a microwave oven. The power supplier of the present disclosure has a solid state frequency converter which changes commercial A.C. power to A.C. power at a high frequency, which A.C. power is increased in voltage in a step-up transformer and then fed to the magnetron. The power supplier further has a control system which stabilizes the power to be applied to the magnetron with respect to a preselected reference level and a power supplier protecting circuit for protecting the power supplier from an unexpected low voltage occurring in the commercial power source.

11 Claims, 18 Drawing Figures

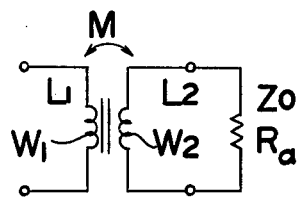
FIG. 3 (a)
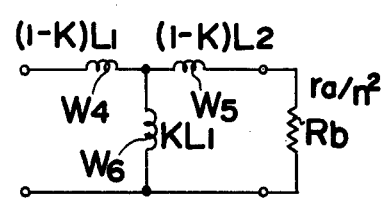
FIG. 3 (b)
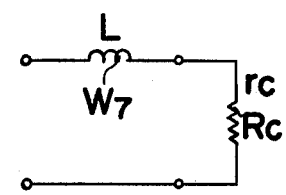
FIG. 3 (c)
FIG. 4
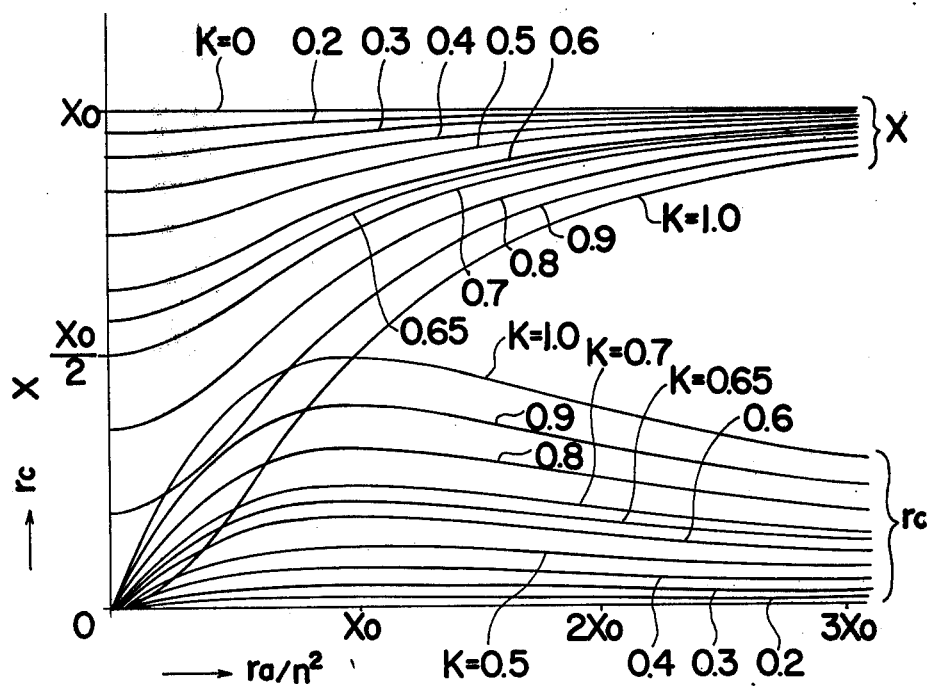

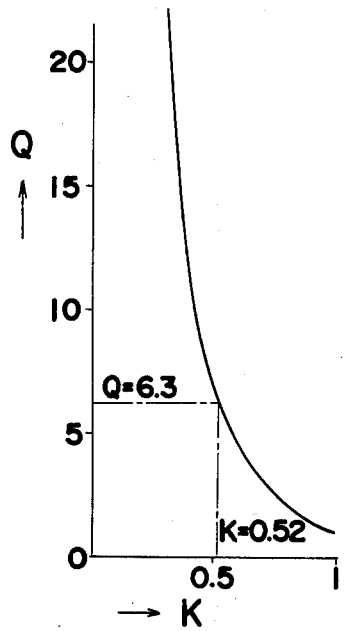
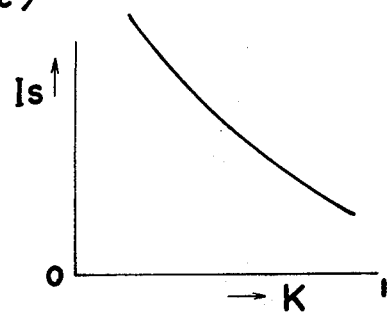
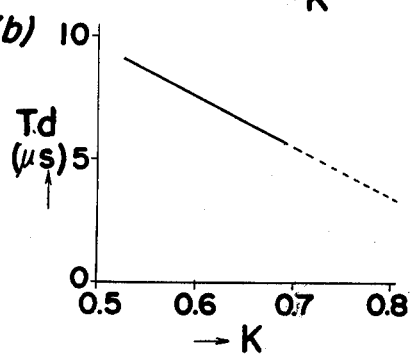
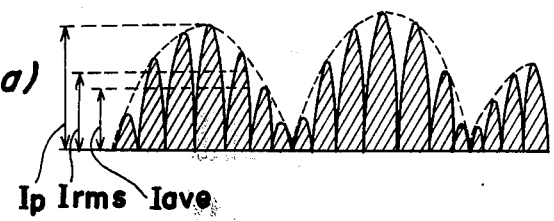
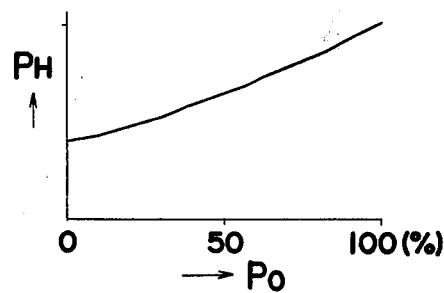
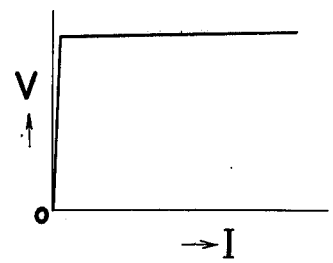

POWER SUPPLIER FOR MAGNETRON

BACKGROUND OF THE INVENTION

The present invention relates to a power supplier, and more particularly to an improved type of power supplier for a magnetron employed in electric appliances, such as a microwave oven.

In a magnetron, it is known that the current voltage characteristic is non-linear. More particularly, the voltage, in the initial stage, increases rapidly up to a certain level, namely a threshold voltage, with a slight increase of the current. Then, in the second stage, i.e., after the voltage reaches the threshold voltage, only a slight further increase of voltage occurs in relation to a considerable increase in the current. It is in the second stage that the magnetron is operated to produce the microwaves. In operating the magnetron, even trivial change or fluctuation in the voltage applied to the magnetron may cause an extreme change in the current, thus causing undesirable fluctuations in the output power. Therefore, in the conventional power supplier for the magnetron, the type of transformer employed therein is a so called constant-current transformer for stabilizing the output power of the magnetron. Such a constant-current transformer is designed to effect voltage regulation by means of a saturated core resonant circuit structure having an inductance portion constituted by a leakage transformer for voltage step-up, and a capacitance portion connected to the secondary side of the transformer.

Such type of transformer requires a comparatively large size core which makes the power supplier large in size and heavy.

Furthermore, in the conventional power supplier, the input power to be applied to the magnetron is controlled in the transformer in which the secondary winding is provided with a plurality of tabs each connected to the secondary winding at particular turns of the winding. The input power can be changed by a change of the tab connected to the magnetron. Such a change in the connection can not be easily carried out because the current flowing therethrough is comparatively large.

SUMMARY OF THE INVENTION

Therefore, a primary object of the present invention is to provide an improved type of power supplier for a magnetron which is compact in size and comparatively light in weight.

Another object of the present invention is to provide a power supplier of the above described type which is provided with a control system for stabilizing the output power produced from the magnetron.

Further object of the present invention is to provide a power supplier of the above described type which is provided with protecting means for protecting the power supplier from an unexpected low voltage occurring in the commercial power source.

A still further object of the present invention is to provide a power supplier of the above described type which has a at low manufacturing cost.

According to the power supplier of the present invention, A.C. power from a commercial power source is converted to A.C. power having a high frequency by a solid state frequency converter. The converter comprises a D.C. power source having a bridge rectifier and a capacitor and a D.C. to A.C. power inverter having at least one semi-conductor switch means, such as a thyristor, trigger means for producing a pulse signal for triggering the thyristor, and a resonant circuit including an inductor element and a capacitor element connected in series. Such inductor element is constituted by a primary winding of a step-up transformer which is to be connected to the converter. The voltage of the high frequency A.C. power is increased in the step-up transformer and is fed to the magnetron through another rectifier. A current transformer is provided for the commercial A.C. power line and for the inverter for detecting the current level passing therethrough and for producing power signals indicative of the power applied to the magnetron, since the power is in relation to the current. Such power signals are applied to a control system in which the power signals are compared with a preselected reference level signal in a comparator circuit employed therein. The comparator circuit generates a difference signal indicative of the difference between the reference level and the power signal. The difference signal is applied to the trigger means described above, in which the frequency of the pulsating signal is controlled. More particularly, the frequency increases when the difference signal indicates that the power signal is smaller than the reference level, and on the other hand, the frequency decreases when the difference signal indicates that the power signal is greater than the reference level, thus stabilizing the input power to the magnetron is relation to the preselected level.

The power supplier of the present invention further includes a protecting circuit which cuts off the power applied to the magnetron upon detection of an unexpected low voltage occurring in the commercial power source.

BRIEF DESCRIPTION OF THE DRAWINGS

These and other objects and features of the present invention will become apparent from the following description taken in conjunction with a preferred embodiment thereof with reference to the accompanying drawings, wherein;

FIGS. 3(a), 3(b) and 3(c) are equivalent circuits for the transformer to be employed in the power supplier;

FIG. 4 is a graph showing impedance characteristics of a load applied to the secondary winding of the transformer when looking into the primary side of the transformer, with respect to various values of the coupling coefficient K of the transformer;

FIG. 5(a) is a graph showing the relation between the quality factor Q and the coupling coefficient K;

FIG. 5(b) is a graph showing the relation between the turn-off time Td and the coupling coefficient K;

FIG. 5(c) is a graph showing the relation between the current flowing through the thyristor and the coupling coefficient K;

FIGS. 6(a) and 6(b) are graphs showing the waveform of the current applied to the magnetron;

FIG. 7 is a graph showing the relation between the power applied to the cathode of the magnetron for heating the same, and the power applied to the magnetron;

FIG. 8 is a graph showing the current-voltage characteristic of the magnetron;

Figure 1:
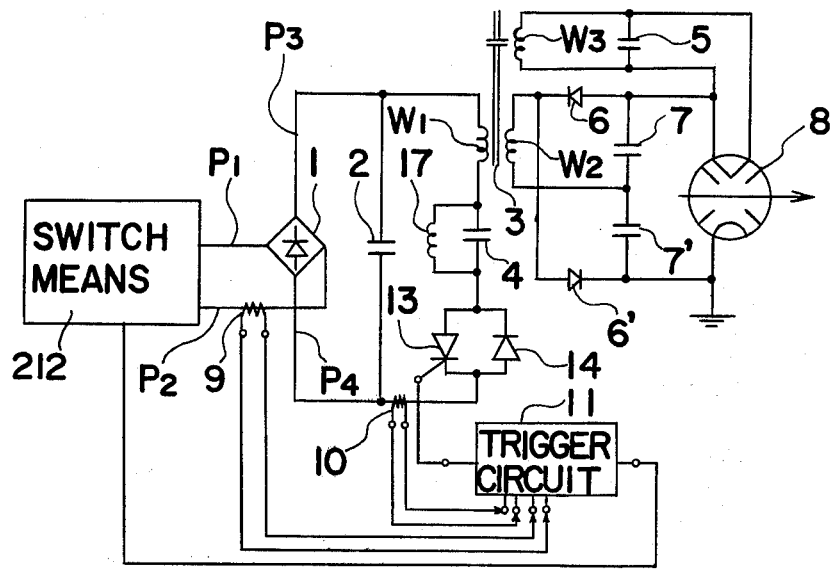
FIG. 1 is a circuit diagram of the power supplier of the present invention.

DETAILED DESCRIPTION OF THE PREFERRED EMBODIMENT rewrite lines 18 to 29 as follows: apparatus or microwave oven. The power supply comprises a switch means, a solid state frequency converter, a step-up transformer and a rectifying circuit that supplies power to the magnetron. Switch means 212 turns the power supplier on and off. The solid state frequency converter includes: the bridge rectifier 1 having one opposite pair of corners connected to switch means 212 through leads P1 and P2 and the opposite corners connected to lines P3 and P4; the capacitor 2; and an inverter which has a thyristor switching circuit including the thyristor 13 and the diode 14, a trigger circuit 11 for providing a trigger signal to the thyristor 13, and a resonant circuit including the capacitor 4, the inductor 17 and the primary winding $W_1$ of the step-up transformer 3 having the inductance of input inpedance thereof serving as a commutation inductance. The secondary winding W2 of the step-up transformer 3 is connected to the rectifier circuit and a secondary winding W3 is connected to capacitor 5. The rectifying circuit is composed of diodes 6 and 6' and capacitors 7 and 7'.

Before the description of the present invention proceeds, it is to be noted that like parts are designated by like reference numerals throughout several views of the accompanying drawings.

Referring to FIG. 1, there is shown a simple circuit diagram of a power supplier for a magnetron incorporated in electrical appliances, such as a microwave heating apparatus or microwave oven. The power supplier comprises a switch means 212 for turning the power supplier on and off, a bridge rectifier 1 in which one opposite pair of corners is connected to said switch means 212 through lead lines P1 and P2 and the other opposite pair of corners is connected to lead lines P3 and P4, a capacitor 2 connected between the lead lines P3 and p4, and an inverter having a step-up transformer 3 having the inductance component of the internal input impedance thereof serving as a commutation inductance, a resonant circuit including a capacitor 4 and an inductor 17, and a gate circuit having a thyristor 13 and a diode 14.

The primary winding W1 of the step-up transformer 3, the capacitor 4 and the thyristor 13 which are connected in series are further inserted between the lead lines P3 and P4, while the inductor 17 and the diode 14 are respectively connected in parallel to the capacitor 4 and the thyristor 13.

The secondary winding W2 of the step-up transformer 3 has the cathode of a diode 6 and the anode of a diode 6' connected to its one end, while the other end thereof is connected to the anode of the diode 6 through a capacitor 7 and to the cathode of the diode 6' through a capacitor 7'. A magnetron 8 has the cathode thereof connected to the anode of the diode 6, while the anode of the magnetron 8 is connected to the cathode of the diode 6'.

The transformer 3 has a subsidiary winding W3 on the secondary side thereof which is connected to the cathode of the magnetron 8 for heating the cathode. A capacitor 5 is connected in parallel to the subsidiary winding W3.

The power supplier further comprises a trigger circuit 11 for applying trigger signals or pulsating signals to the gate terminal of the thyristor 13. The trigger circuit 11 is coupled with a current transformer 9 which is applied to the lead line P2 and a current transformer 10 which is applied to the lead line P4. These current transformers 9 and 10 are provided for detecting the value of the current flowing through the lead lines P2 and P4. Such detected values are applied to the trigger circuit in which the frequency of the produced pulsating signal is controlled to stabilize the operation of the magnetron, the manner of which is described in detail later.

In the meantime, the function of the power supplier, particularly the feature of the step-up transformer 3, is explained hereinbelow.

Upon receipt of a pulse signal at the gate of the thyristor 13 from the trigger circuit 11, the thyristor 13 is made conductive to allow a current to flow from the lead line P3 through the winding W1, the capacitor 4 and through the thyristor 13 to the lead line P4. During the period when the thyristor 13 is conducting, the capacitor 4 is charged, and in turn is discharged through the diode 14 and through the winding W1, thus causing a current to resonantly flow in a direction opposite to the former current flow, and biasing the thyristor 13 in a reverse direction for turning off the same from its conductive state, while the capacitor 4 is consequently charged with the opposite polarity. Since the resonant frequency produced by the inductor 17 and the capacitor 4 is extremely low when compared with the resonant frequency resulting from the winding W1 and the capacitor 4, the capacitor 4 maintains its charged state until the thyristor 13 receives the next pulsating signal from the trigger circuit 11. Upon receipt of a next pulsating signal at the gate of the thyristor 13 from the trigger circuit 11, the thyristor 13 is again made conductive, thus producing the same operation as described above to complete one cycle in the resonant circuit formed by the winding W1 and the capacitor 4.

Figure 2:
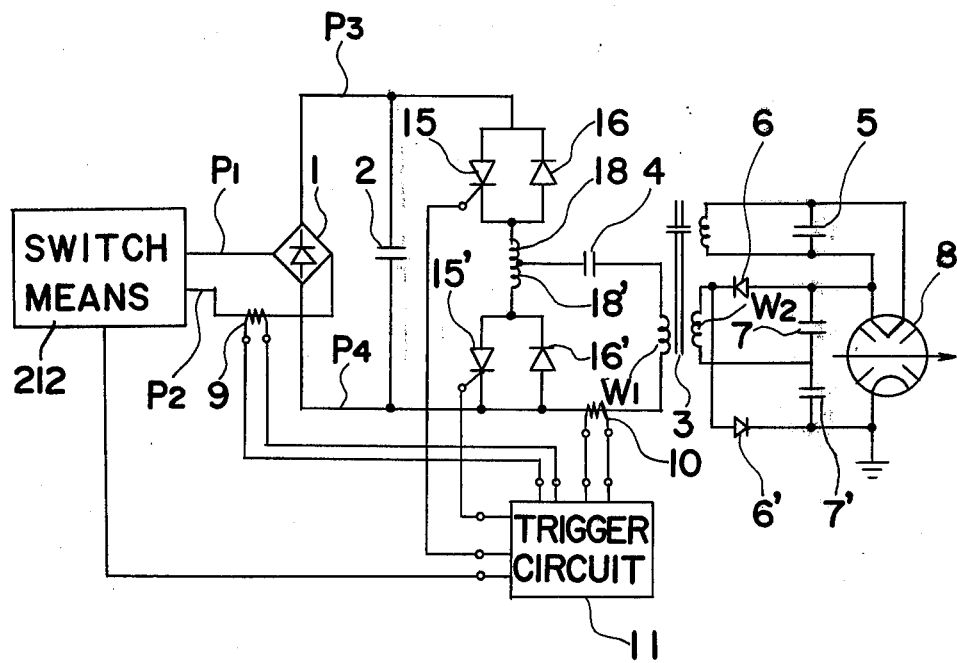
FIG. 2 is a diagram similar to that of to FIG. 1, but particularly shows a modification thereof.

Referring to FIG. 2, there is shown a circuit diagram similar to that of FIG. 1, but particularly showing a modification of the power supplier.

The power supplier in FIG. 2 has two sets of gate circuits instead of one. The first gate circuit having parallel-connected thyristor 15 and diode 16 is connected to the lead line P3, and in turn are connected to coils 18 and 18' connected in series which are provided for controlling the current flowing therethrough.

The second gate circuit having parallel-connected thyristor 15' and a diode 16' is connected between the coil 18' and the lead line P4. One end of the primary winding W1 of the transformer 3 is connected to a point between the coils 18 and 18' through the capacitor 4, while the other end is connected to the lead line P4.

The operation of the power supplier shown in FIG. 2 is described hereinbelow.

In the first step, each time a pulse of the pulsed signal from the trigger circuit 11 is applied to the gate of the thyristor 15, and thus the thyristor 15 is made conductive to allow a current to flow from the lead line P3 through the coil 18, the capacitor 4 and to the primary winding W1 of the transformer 3. During said current flow, the capacitor 4 is charged positively, i.e., the capacitor plate connected to the coil 18 is positively charged. Due to energy storage and oscillations caused by the series connection of inductor 18, capacitor 4 and step-up transformer 3 primary winding W1, the voltage across capacitor 4 momentarily exceeds the voltage across capacitor 2. Subsequently, the capacitor 4 starts to discharge, thus causing a current to flow in the opposite direction through the diode 16. During the current flow through the diode 16, the thyristor 15 is biased in the reverse direction by a voltage drop across the diode 16, thus de-energizing or turning off the thyristor 15. Capacitor 4 discharges through diode 16 until the voltage across capacitor 4 equals that across capacitor 2. In the second step, after the thyristor 15 has been turned off, the thyristor 15' is made conductive by a pulse signal applied to the gate of the thyristor 15', and thus a current is caused to flow from the capicator 4 through the primary winding W1, the coil 18' and to the thyristor 15'. During said current flow, the capacitor 4 is charged negatively, i.e., the capacitor plate connected to the coil 18' is negatively charged. Subsequently, the capacitor 4 starts to discharge, thus causing a current to flow in the opposite direction through the diode 16'. During the current flow through the diode 16', the thyristor 15' is biased in the reverse direction by a voltage drop across the diode 16', thus deenergizing or turning off the thyristor 15'.

Because trigger circuit 11 repeatedly fires first thyristor 15 and then thyristor 15', an alternating current having a high frequency is fed to the primary winding W1.

It should be noted that the time span during which the thyristor 15 or 15' is turned off, namely the turn-off time Td, is determined by an oscillator, e.g., a programable uni-junction transistor (PUT), employed in the trigger circuit 11, in which the oscillator produces a pulsating current a predetermined time after the moment when the current transformer 10 detects the zero level of the alternating current flowing through the lead line P4. Such a predetermined time is equal to the turn-off time Td which dominates the amplitude and frequency of the alternating current produced in the lead line P4, thus controlling the power to be applied to the magnetron 8. Referring to FIG. 3(a), there is shown a first equivalent circuit for the step-up transformer 3, in which the reference characters L1 and L2 designate values of the self-inductance in the primary and secondary windings W1 and W2, while the reference character M designates the value of the mutual inductance between the primary and secondary windings W1 and W2, and the reference character ra designates the impedance value of a load Ra connected to the secondary winding W2. The load Ra is considered to have equivalent impedance to that of the magnetron 8. The degree of the coupling between the primary and secondary windings W1 and W2 can be expressed by a coefficient of coupling K which can be given by the following equation.

$$K = M / (L1 \cdot L2)^{1/2} \qquad (1)$$

Provided that the numbers of turns of the windings in the primary and secondary windings W1 and W2 are N1 and N2, the winding ratio $n$ will be $$n = N2/N1 \qquad (2)$$

Referring to FIG. 3(b) there is shown a second equivalent circuit for the step-up transformer 3 utilizing the above described coupling coefficient K and winding ratio $n$ to give the impedance seen when looking into the primary side of the transformer 3, in which inductors W4, W5 and W6 are connected in a T network, each having an inductance value of (1-K)L1, (1-K)L1 and KL1, respectively. In this case, a load Rb connected in parallel to the winding W6 through the winding W5 has an impedance of ra/$n^2$ which is considered to be equivalent to that of the magnetron 8.

A further simplified equivalent circuit, which is a third equivalent circuit is shown in FIG. 3(c) in which a winding W7 has the inductance of L and a load Rc connected in series therewith has the impedance of rc.

Since the circuit shown in FIG. 3(c) is equivalent to the transformer 3 provided with the magnetron 8, the electrical power consumed in the magnetron 8 will be equal to the electrical power consumed in the load Rc. Therefore, according to the equivalent circuit shown in FIG. 3(c), the electrical power Po consumed in the magnetron 8 can be given by the equation as follows, $$Po = Ie^2 \cdot Rc \qquad (3)$$

wherein Ie designates an effective value of the current flowing through the load Rc.

It should be noted that the circuit for heating the cathode of the magnetron 8 is neglected in the above described equivalent circuits, since the amount of power consumed therein is comparatively small.

Since the electrical power Po consumed in the magnetron 8 can be expressed as Po = Ie$^2$·Rc, the bigger the impedance rc of the load Rc becomes, the smaller the current flowing through the thyristor becomes, provided that the electrical power Po is constant. On the other hand, as the impedance rc becomes bigger, the quality factor Q of the resonant circuit becomes smaller, and thus the attenuation of the resonant current becomes greater. These facts signify that the turn-off time Td of the thyristor will become smaller as the impedance rc becomes larger.

The description hereinbelow is directed to the feature of the transformer 3 in connection with tests carried out by the inventors. The magnetron used in the tests had a rated output power of 600 Watts and an operating voltage of 3 kv. In order to obtain an effective impedance Re of the magnetron 8, the rectifying circuit having the diode 6 and 6' and capacitors 7 and 7' is replaced by a bridge rectifying circuit, in which case the waveform of the current applied to the anode of the magnetron 8 was similar to those shown in FIG. 6(a).

In order to prevent the structural components, such as diodes, thyristors, etc., from physically resonating to produce a buzzing noise, the frequency of the converter was made to be between 20 KHz to 25 KHz. Therefore, the waveform of the current flowing to the anode of the magnetron 8 was such that a high frequency wave, e.g., 25 KHz, was modulated into a commercial low frequency wave, e.g., 60 Hz. Since the shape of such a waveform shown in FIG. 6(a) is approximately equal to a sine curve, the relation between a peak value Ip and an average value Iave of the current flowing to the anode of the magnetron 8 can be expressed as follows.

$$Iave = \frac{2}{\pi} \cdot \frac{2}{\pi} \cdot Ip \qquad (4)$$

Since an effective value Irms of the magnetron anode current can be expressed as $$Irms = \frac{1}{\sqrt{2}} \cdot \frac{1}{\sqrt{2}} \cdot Ip \qquad (5)$$

the equation (5) can be represented by the following equation.

$$Irms = \frac{\pi^2}{8} \cdot Iave \qquad (6)$$

By defining the effective voltage drop between the anode and cathode of the magnetron 8 as $V_{AK}$, the effective impedance Re of the magnetron 8 can be given by , $Re = V_{AK}/Irms$ It should be noted that an approximate value of such effective impedance Re can be given as , $Re \doteq V_{AK}/Iave$ because of the fact that the value of Iave is approximately equal to the value of Irms.

Referring to FIG. 4, there is shown a graph in which the relations between the inductive reactance WoL (Wo is equal to $2\pi fo$, in which the frequency fo is a predetermined value, e.g., 25 KHz, and WoL is defined as X hereinbelow) obtained from the coil W7 and the impedance $ra/n^2$ of the load Rb and between the impedance rc of the load Rc and the impedance $ra/n^2$ of the load Rb, with respect to various K values are given. In the graph, the abscissa represents the impedance $ra/n^2$ of the load Rb, while the ordinate represents the inductive reactance X of the coil W7 and also the impedance rc of the load Rc.

It should be noted that the size or magnitude of such variables, i.e., impedance $ra/n^2$, inductive reactance X and impedance rc are given in comparison with the value of WoL1 (defined as Xo hereinbelow) which is constant.

It should also be noted that the curves X are obtained by the equation $$X = \frac{(1 - K^2)Xo^3 + (ra/n^2)^2 Xo}{(ra/n^2)^2 + Xo^2} \qquad (7)$$

while the curves rc are obtained by the equation.

$$rc = \frac{K^2(ra/n^2) \cdot Xo^2}{(ra/n^2)^2 + Xo^2} \qquad (8)$$

As is apparent from the graph shown in FIG. 4, the peak value of the $ra/n^2$ is obtained when the impedance $ra/n^2$ has the value of Xo, thus the following equation being obtained.

, $ra/n^2 = Xo$ , (9)

Accordingly, the ratio n of the secondary winding W2 to the primary winding W1 is determined by the above equation (9). Therefore, a step-up transformer which satisfies the equation (9) will produce a maximum power output for the least amount of current flowing through the thyristor.

It would be noted that the ratio n obtained by the equation (9) is applied when the high voltage rectification is carried out by bridge type rectification. For voltage doubling type rectification as in the present invention, it will be understood that the value of the ratio n of the secondary winding W2 is the primary winding W1 is can be half the value of the ratio n as described above. In general, when the high voltage rectification is carried out by an m-multiple voltage rectification, i.e., a rectification in which the rectified voltage is equal to m times the original voltage, such ratio can be $1/m$ of the value of the ratio n.

The description is now directed to the coupling coefficient K of the step-up transformer.

Provided that the winding ratio n is determined achieve the condition that the impedance $ra/n^2$ is equal to the value of Xo, the quality factor Q for the series resonant circuit formed by the step-up transformer 3, magnetron 8 and commutation capacitor 4 can be given as $$Q = \frac{\text{reactance}}{\text{resistance}} = \frac{2 - K^2}{K^2} \qquad (10)$$

The graph shown in FIG. 5(a) has a curve which will satisfy the equation (10), in which graph the abscissa and the ordinate represent the coupling coefficient K and the quality factor Q.

In order to operate the converter with efficiency, it is required that the current flowing through the thyristor be as small as possible and yet have sufficient power. Since the quality factor can be expressed as, $$Q = \frac{WoL}{rc} = \sqrt{L/c/rc} = \frac{1}{Wocrc} \qquad (11)$$

$$= 2\pi \frac{\text{maximum stored energy}}{\text{energy dissipated per cycle}}$$

wherein C is the capacitance of the capacitor 4, the best efficiency for the inverter can be obtained when the maximum stored energy is equal to the energy dissipated per cycle. In other words, the quality factor Q is equal to the value of $2\pi$ which is approximately equal to 6.3. If the value of the quality factor Q should become smaller than $2\pi$, the converter will not operate to produce the necessary power. Therefore, it is preferable to have the value of the quality factor Q larger than 6.3, which means that the coupling coefficient K will be smaller than 0.52. However, such a limit for the coupling coefficient K has some degree of variation because of the fact that the inductive reactance values of the elements, such as coils 18 and 18' have been disregarded and that the impedance characteristics of the magnetron taken into consideration were an approximation of the true impedance characteristic which is shown in FIG. 8.

The graph shown in FIG. 5(b) shows the available range for the coupling coefficient K which is obtained from the tests carried out by the inventors. It should be noted that the tests were carried out under the condition that the output power from the magnetron was maintained at a certain level. In the graph, the abscissa and ordinate represent the values of the coupling coefficient K and the turn-off time Td, respectively.

As it is apparent from the graph shown in FIG. 5(b), the upper limit for the available range for the coupling coefficient K can be extended to 0.7, because there is a difference between the resonant frequency of the series resonant circuit and the output frequency of the inverter, and because there will be produced more inductance value in the resonant circuit than the inductance value of step-up transformer 3 due to the additional inductance value in, e.g., coils 18 and 18' and the lead lines. It should be noted that the thyristor used in the test was a type in which the turn-off time Td was approximately 6 μA, which has a reasonable manufacturing cost. However, if thyristors, having shorter turns-off time Td, e.g., 3 to 5 μS, should become available at a reasonable manufacturing cost, then, the upper limit for the coupling coefficient K can be further extended to 0.8.

On the other hand, if the coupling coefficient K were to be reduced to 0.3 to 0.4, the quality factor Q would range between 11 and 21. Therefore, the ratio of the maximum stored energy to the energy dissipated per cycle, which is equal to the ratio of the quality factor Q to the value $2\pi$, would range from approximately 2 to 4. These numerals 2 to 4 indicate that the converter must sustain a current flowing therethrough which is 2 to 4 times the current necessary in the thyristor, thus reducing the efficiency thereof.

As a consequence, the range for the coupling coefficient K should be between 0.4 and 0.8 for reasonable operation. For optimum operation of the converter for running the magnetron, the coupling coefficient K should range between 0.5 and 0.6.

The graph shown in FIG. 5(c) shows the relation between the current Is flowing through the thyristor and the coupling coefficient K, also obtained from the same tests carried out by the inventors. In the graph, the abscissa and ordinate represent the values of the coupling coefficient K and the current Is, respectively.

Referring back to FIG. 1, the electrical power at a high voltage produced from the secondary winding W2 is supplied to the magnetron 8 through the full-wave rectifying circuit having the diodes 6 and 6' and capacitors 7 and 7'. Such a full-wave rectifier is particularly suitable because of the low manufacturing cost thereof. If such a full-wave rectifying circuit is constituted by a bridge rectifier, the power produced from said bridge rectifier is equal to the hatched portion shown in FIG. 6(a), in which case the waveform thereof is such that the high frequency signal e.g., 25 KHz is modulated into the commercial low frequency signal, e.g., 60 Hz. However, since the power to be provided to the magnetron 8 is preferably at a in constant level, a smoothing capacitor should be provided between the bridge rectifier and the magnetron 8, for smoothing the waveform of the rectified signal to that as shown in FIG. 6(b). In such a case, the smoothing capacitor must be of a type having a large capacitance and suitable for tolerating high voltage and high frequency, thus resulting in a high manufacturing cost. On the other hand, the capacitors 7 and 7' shown in FIG. 1 can be of a type having a low capacitance, and thus the manufacturing cost is not as high as the previous type.

The subsidiary winding W3 forms a constant-voltage type transformer together with the primary winding W1 for providing electrical power to the cathode of the magnetron 8. Since the frequency and amplitude of the voltage applied to the primary winding W1 change with a change of the pulsating signal from the trigger circuit 11, the power produced at the subsidiary winding W3 may fluctuate above or below the optimum level, thus resulting in deterioration of the electromagnet or burn out of the transformer. Such fluctuation is eliminated by providing a ferro-resonance element between the capacitor 5 and the subsidiary winding W3, utilizing the saturation of the core thereof for control. According to the tests carried out by the present inventors, the relation between the power Po supplied to the magnetron 8 and the power $P_H$ supplied to the heater therefor is shown in the graph in FIG. 7, in which the abscissa and ordinate represent the power Po and the power $P_H$, respectively. As is apparent from the graph, the the decrease in the power $P_H$ is smaller than that of the power Po, and thus the deterioration of the electromagnet will not occur due to lack of electron-emission when setting the magnetron for a low output.

Figure 9:
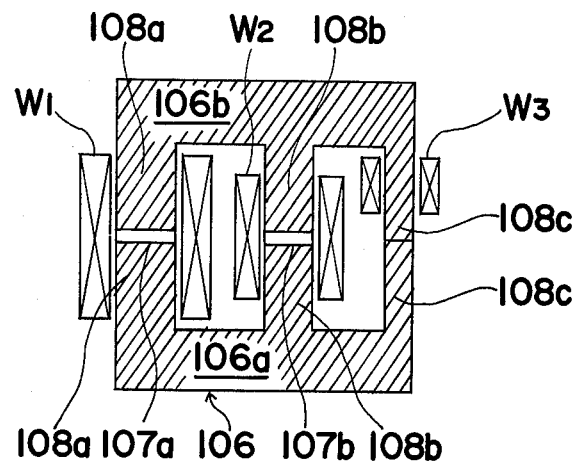
FIG. 9 is a cross sectional view of the transformer employed in the power supplier of the present invention.

Referring to FIG. 9, there is shown a cross sectional view of one type of the transformer 3 which will satisfy the above described requirements, i.e., the coupling coefficient K being between 0.4 and 0.8 and also suitable for producing a parallel ferro-resonant circuit between the core therefor and the capacitor 5. The transformer 3 comprises a core 106 formed by a pair of "E" shaped bodies 106a and 106b. Among the three parallel arm portions 108a, 108b and 108c in the bodies 106a and 106b, two neighboring arms 108a and 108b are shorter than the remaining arm 108c, so that when the bodies 106a and 106b are disposed with their arms opposed to construct the core 106, the short arms 108a and 108b do not contact each other but define gaps 107a and 107b therebetween. Provided around the arm portions 108a, 108b and 108c are primary winding W1, secondary winding W2 and subsidiary winding W3, respectively. The gaps 107a and 107b are preferably formed to produce the coupling coefficient K at a preselected value which is between 0.4 and 0.8 as described above.

It should be noted that other types of transformers are usable for this power supplier as long as they are step-up transformers having a coupling coefficient K between 0.4 and 0.8.

Figure 10:
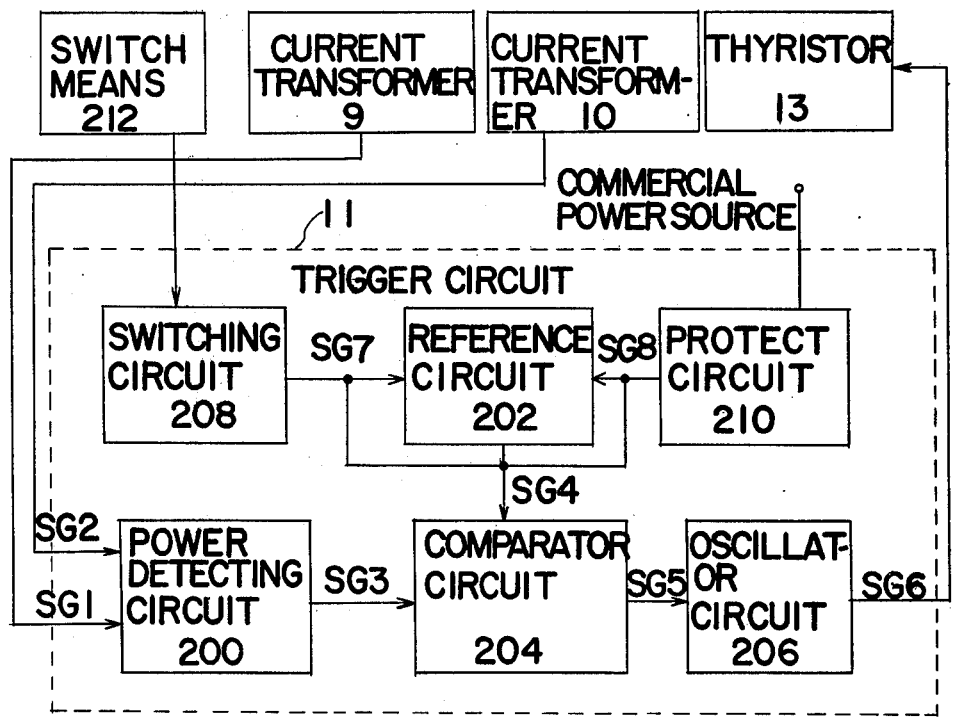
FIG. 10 is a block diagram of a trigger circuit.
Figure 11:
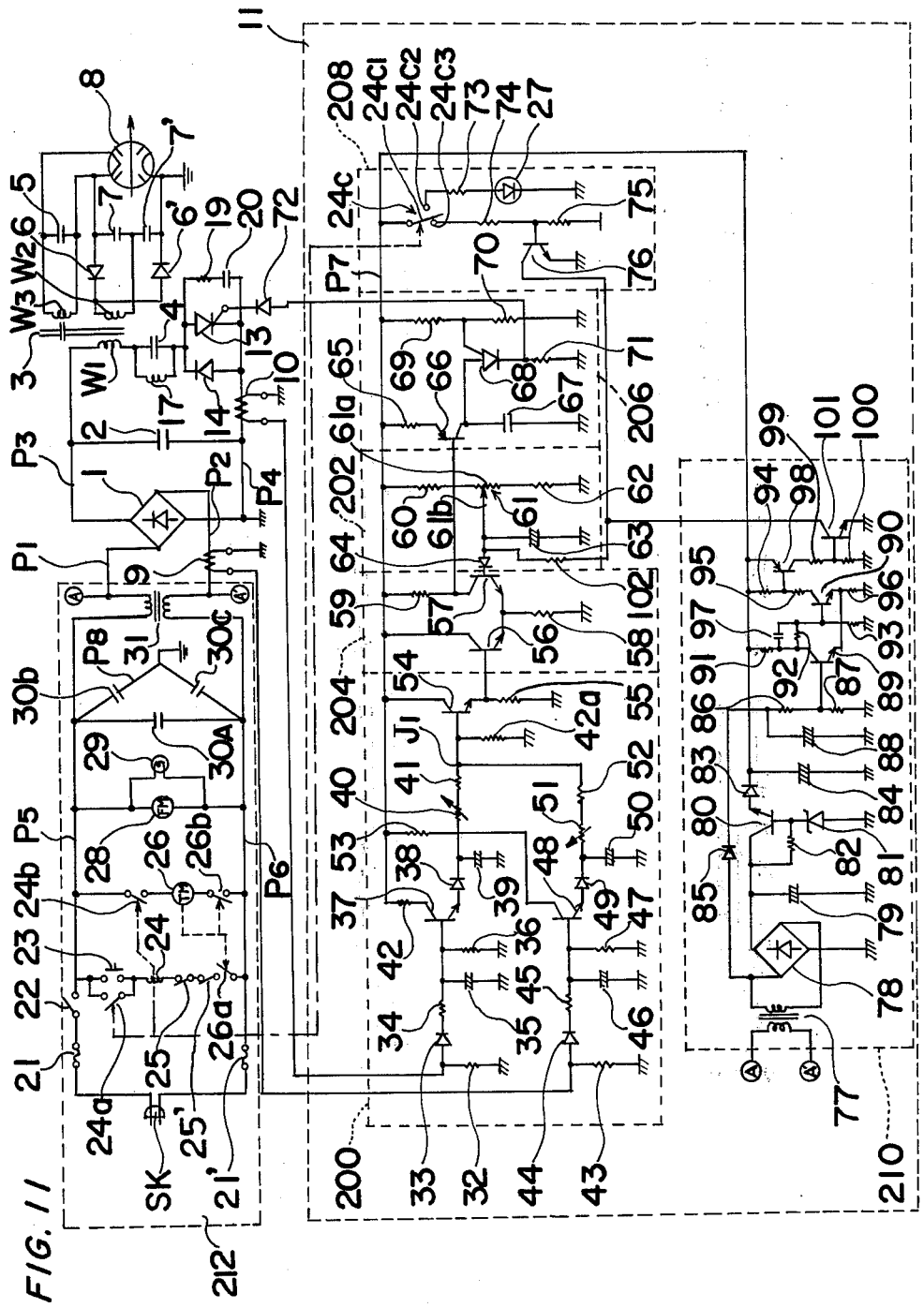
FIG. 11 is a complete circuit diagram for the power supplier of the present invention.

Referring to FIG. 11, there is shown a complete circuit for the power supplier coupled to the magnetron 8 and shown diagrammatically in FIG. 10, and in which the trigger circuit 11 is encircled by a dotted line. Firstly, the structure of the switch means 212 will be described. The electrical power from the commercial electrical source is taken into main lead lines P5 and P6 through a socket SK. Provided in the lines P5 and P6 through a socket SK. Provided in the lines P5 and P6 are fuse means 21 and 21' positioned next to the socket SK, and also a main switch 22 next to the fuse means 21. Connected between the lines P5 and P6 are a cooling fan 28 for cooling the magnetron 8 and a lamp 29 for lighting inside an oven and for indicating the on-state of the main switch 22. A timer switch 26 for setting the cooking time has a switch 24b connected to its one terminal which in turn is connected to the lead line P5. The other terminal is connected to the switch 26b which is further connected to the lead line P6. One end of a relay 24 is connected to a cook switch 23 which in turn is connected to the lead line P5, while the other end thereof is connected to the lead line P6 through a door switch 25, a latch switch 25' and a switch 26a. A switch 24a is connected in parallel with the cook switch 23.

The switches 26a and 26b are coupled to the timer switch 26 which turns on the switches 26a and 26b during its set period. Upon pressing or turning on the cook switch 23, the relay 24 is energized for turning on the switches 24a and 24b. The relay 24 further operates a switch 24c which is incorporated in the trigger circuit 11 for starting a generation of the pulsating signal therefrom in a manner which is described later. Further connected between the lead lines P5 and P6 are a triangle network of capacitors 30a, 30b and 30c and a choke coil 31, which elements are provided for filtering the noise produced in the circuit. It should be noted that a lead line connecting the capacitors 30b and 30c is grounded to the case of the oven (not shown), while other portions in the circuit to be grounded are connected to the chassis of the circuit which is isolated from said case.

Referring to FIG. 10, the trigger circuit 11 comprises a power detecting circuit 200 for detecting the power supplied to the magnetron 8 upon receipt of signals SG1 and SG2 from the current transformers 9 and 10 and for producing a signal SG3 which is proportional to the detected value, a reference circuit 202 for presetting a reference signal at a predetermined level which is related to the power to be supplied to the magnetron 8 and for generating a signal SG4 indicative of said predetermined level, a comparator circuit 204 for comparing said signals SG3 and SG4 and for producing a signal SG5 which is in accordance with the difference between the signals SG3 and SG4, an oscillator circuit 206 for supplying a pulsating signal SG6 the thyristor 13 at a frequency proportional to the signal SG5, a switching circuit 208 for turning the oscillator circuit 206 on and off in accordance with the on and off state of the switch 24a, and a protecting circuit 210 for protecting the circuit, for example, from an unexpected low voltage occurring in the voltage of the commercial power source.

Referring again to FIG. 11, the power detecting circuit 200 comprises a transistor 48 receiving the signal SG1 at its base from the current transformer 9 through a diode 44 and a resistor 45. A capacitor 46 and a resistor 47 are connected between the base of the transistor 48 and the ground, while a resistor 43 is connected between the anode of the diode 44 and the ground. The collector of the transistor 48 is connected to a positive lead line P7 through a resistor 53, while the emitter thereof is connected to a junction J1 through a diode 49, a variable resistor 51 and a resistor 52. A capacitor 50 is connected between the cathode of the diode 49 and the ground.

The power detecting circuit 200 further comprises a transistor 37 receiving the signal SG2 at its base from the current transformer 10 through a diode 33 and a resistor 34. A capacitor 35 and a resistor 36 are connected between the base of the transistor 37 and the ground, while a resistor 32 is connected between the anode of the diode 33 and the ground. The collector of the transistor 37 is connected to the positive lead line P7 through a resistor 42, while the emitter thereof is connected to the junction J1 through a diode 38, a variable resistor 40 and a resistor 41. A capacitor 39 is connected between the cathode of the diode 38 and the ground. The signal appearing at the junction J1 is a combination of modified signals SG1 and SG2. The junction J1 is connected to the base of a transistor 54 and also to the ground through a resistor 42a. The collector of the transistor 54 is connected to the positive lead line P7 and the emitter thereof is connected to the ground through a resistor 55. The signal obtained at the emitter of the transistor 54 is the signal SG3 which is proportional to the sum of the signals SG1 and SG2. The signal SG3 is then applied to the comparator circuit 204.

The comparator circuit 204 comprises transistors 56 and 57 having their emitters connected to each other and then to the ground through a resistor 58. The collector of the transistor 56 is connected to the positive lead line P7 directly, while the collector of the transistor 57 is connected to the positive lead line P7 through a resistor 59. The base of the transistor 56 receives the signal SG3, while the base of the transistor 57 receives the signal SG4 from the reference circuit 202. The reference circuit 202 comprises a potentiometer 61 having a resistor 61a one end of which is connected to a resistor 60 which in turn connected to the positive lead line P7, while other end is connected to a resistor 62 which in turn connected to the ground. The sliding arm 61b of the potentiometer 61 is connected to four different places, i.e., first to the ground through a capacitor 63, second and third to the switching circuit 208 and the protecting circuit 210 and fourth to the comparator circuit 204 at the base of the transistor 57 through a diode 64.

The oscillator circuit 206 has a transistor 66 with the base connected to the comparator circuit 204 at the collector of the transistor 57 and having the emitter thereof connected to the positive lead line P7 through a resistor 65 and the collector thereof connected to the ground through a capacitor 67. A programmable unijunction transistor (PUT) 68 has the gate thereof connected to the collector of the transistor 66, while the anode thereof is connected to the junction of series connected resistors 69 and 70 which are connected to the positive lead line P7 and the ground, respectively. The cathode at which the pulsating signal SG6 is generated is connected to the gate of the thyristor 13 through a diode 72, and also to the ground through a resistor 71.

The switching circuit 208 comprises a relay switch 24c in which a contactor 24c1 thereof contacts either a stationary contact 24c2 or at 24c3. The contact 24c2 is connected to the ground through a resistor 73 and a photo-diode 27 connected in series. The other contact 24c3 is connected to the base of a transistor 76 through a resistor 74. The base of the transistor 76 is further connected to the ground through a resistor 75. The emitter of the transistor 76 is connected to the ground and the collector thereof is connected to the reference circuit 202.

The protecting circuit 210 comprises a transformer 77 the primary winding of which is connected to the commercial power supply and a bridge rectifier 78 one of opposite pairs of corners of which is connected to the secondary winding of the transformer, while the other of the opposite pairs of corners is connected between the positive lead line and the ground.

A transistor 80 has the collector and the emitter connected in the positive lead line P7 while the base thereof is connected to a zener diode 81. The base and the collector of the transistor 80 are connected to each other through a resistor 82, and the collector thereof is connected to the ground through a capacitor 79. The emitter of the transistor 80 is connected through a diode 83 to the positive lead line. The cathode of the diode 83 is connected to the ground through a capacitor 84. One end of the secondary winding of the transformer 77 is connected to the ground through a diode 85 and resistors 86 and 87. The cathode of the diode 85 is connected to the ground through a capacitor 88. Connected to the resistor 87 is a schmidt trigger circuit formed by transistors 89 and 90. The emitters of the transistors 89 and 90 are connected to the ground through a resistor 96. The collector of the transistor 89 is connected to the positive lead line P7 through a resistor 91 and also to the base of the transistor 90 through a parallel connection of a capacitor 97 and a resistor 92. The base of the transistor 90 is connected to the ground through a resistor 93. The collector of the transistor 90 is connected to the positive lead line P7 through resistors 94 and 95, between which a base of a transistor 98 is connected. The emitter of the transistor 98 is connected to the positive lead line and the collector thereof is connected to the ground through resistors 99 and 100. Connected between the resistors 99 and 100 is a base of a transistor 101 the emitter of which is connected to the ground and the collector is connected to the reference circuit 202 through the resistor 102.

The operation of the trigger circuit 11 is explained hereinbelow, in connection with the other components of the power supplier.

The relay 24 is not energized before turning on the switch 23 so that the relay switches 24a and 24b coupled to the relay 24 are not turned on and the relay switch 24c has its contactor contacting the contact 24c3, so that the transistor 76 is held in conductive state for shortcircuiting the capacitor 63. Upon setting the timer motor 26 to a preferable cooking time, during which the switches 26a and 26b are maintained in the on state, and upon turning on the cooking switch 23, the relay 24 is energized to turn on the relay switches 24a and 24b and to shift the contactor 24c1 from the contact 24c3 to the contact 24c2 whereby the photo-diode 27 is energized to produce light therefrom to indicate that the oven is now in the onstate. Disconnection of the contactor 24c1 from the contact 24c3 de-energizes the transistor 76, and as a result the capacitor 63 is ready to be charged. The capacitor 63 is charged by the voltage determined by the potentiometer which has been preset at a preferable level. The charged voltage, i.e., the signal SG4 is applied to the comparator circuit 204 in which the charged voltage is compared with the voltage of the signal SG3 obtained from the power detecting circuit 200. The difference in the voltage between the signals SG3 and SG4, i.e., the signal SG5 is applied to the base of the transistor 66 which changes its conductivity according to the value of the signal SG5. The current flowing through the transistor 66 then charges the capacitor 67 which raises the voltage level at the gate of the PUT 68, thus oscillating the PUT 68 and producing the pulsating signal from the cathode thereof. When the voltage level at the gate of the PUT 68 reaches a certain level, the anode and the cathode of the PUT 68 become conductive, thus producing one pulse signal from the cathode thereof. During the generation of the pulse signal, the electrons charged in the capacitor 67 are also discharged through the PUT 68 thus dropping the voltage level at the gate of the PUT 68. Since the capacitor 67 is constantly charged by the current flowing through the transistor 66, the voltage level at the gate of the PUT 68 is raised again, thus producing a second pulse signal therefrom. These steps are repeated again and again to oscillate the PUT 68. The frequency of the pulse signal is determined by the rate of charge of the capacitor 67, i.e., the amount of current flowing through the transistor 66. This amount of current is controlled by the base voltage of the transistor 66. The description hereinbelow is directed to the way in which the power applied to the magnetron is controlled.

When the power applied to the magnetron 8 increases, the level of the signals SG1 and SG2 generated in the current transformer 9 and 10 increase, thus the level of signal SG3 indicative of the power applied to the magnetron 8 increases. The increased level signal SG3 applied to the comparator circuit 204, more particularly to the base of the transistor 56, affects the voltage level at the emitter of the transistor 56. Since the base of the transistor 57 is connected to the potentiometer 61 producing a preselected voltage level, the voltage level at the collector of the transistor 57 increases. Therefore, the voltage difference between the base and the emitter of the transistor 66 decreases, thus decreasing the current flowing towards the capacitor 67, and as a result the frequency of the pulse signal SG6 is reduced. Since said frequency is proportional to the power applied to the magnetron 8, the power is thus reduced.

When the power applied to the magnetron 8 decreases, the circuits described in the foregoing description function in the opposite manner, thus increasing the frequency of the pulse signal to increase the power to be applied to the magnetron 8.

At the moment when the power is turned on, i.e., the switch 23 is turned on, the capacitor 63 having comparatively large time-constant, is charged by degrees, thus gradually changing the state of the transistor 57 from the off-state to the on-state. Therefore, at the beginning, the frequency of the pulse signal increases gradually up to the preselected value, for example to 25 KHz. In other words, the power applied to the magnetron 8 increases gradually until it reaches the optimum level. Such gradual increase in the power is particularly suitable for starting the magnetron 8 in a stable condition without troublesome fluctuations. Although the cathode of the magnetron 8 is preheated up to a certain level, it is not sufficient for normally running the magnetron 8. If the magnetron 8 were to receive a high frequency voltage or a high level of power at the moment of starting, the electrons emitted from the cathode would not be enough to balance the high power, thus some electrical energy would be accumulated, for example, between the wires of the secondary windings W2 as a floating charge which might oscillate to produce troublesome fluctuations.

Figure 12:
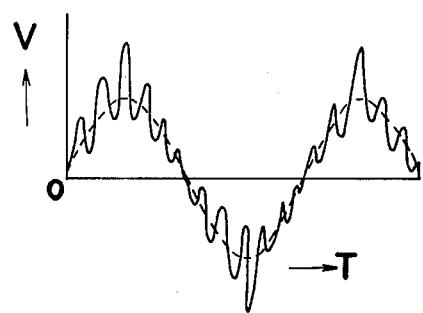
FIG. 12 is a waveform of an abnormal voltage produced from a subsidiary winding of the transformer.

Referring to FIG. 12, there is shown an abnormal voltage which would be produced across the subsidiary winding W3, particularly when the power is turned on and rapidly increased to a high power level. Since the power applied to the magnetron 8 gradually increases to a high optimum level, as described above, such high power is supplied to the magnetron 8 after the cathode of the megnetron 8 has been heated up to the certain level. Therefore, according to the present invention, such abnormal voltage will not be produced in the subsidiary winding W3.

It should be noted that instead of gradually increasing the power, the same effect can be achieved by first running the magnetron at a comparatively low frequency, then changing to the high frequency for running in the normal state. The protecting circuit 210 operates when an unexpected low voltage occurs in the commercial power source. Such low voltage is led through the diode 85, and the resistors 86 and 87 to the ground, thus a substantially low voltage being produced across the resistor 87. Such low voltage is applied to the schmidt trigger circuit which produces a signal towards the base of the transistor 101 which in turn connects the capacitor 63 to the ground, so that the capacitor 63 is discharged. The result is that the comparator circuit 204 stops supplying the signal SG5 to the oscillator circuit 206 so that the pulse signal is not produced therein.

Therefore, the power supplier is protected from such low voltage occurring in the commercial power source.

Figure 13:
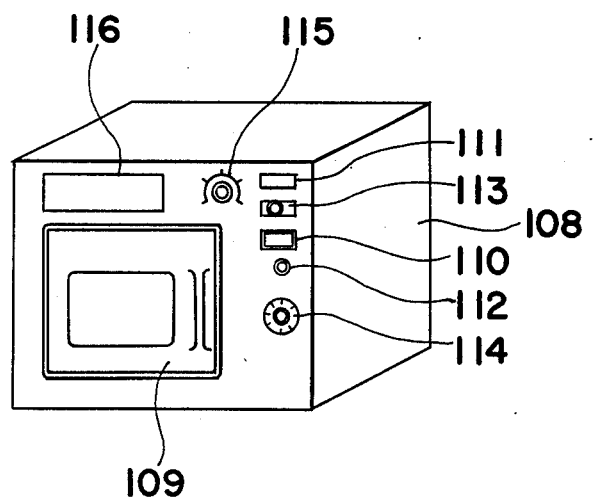
FIG. 13 is a perspective view of a microwave oven in which the power supplier of the present invention is employed.

Referring to FIG. 13, there is shown a perspective view of the microwave oven in which the power supplier is incorporated. The microwave oven has a housing 108 of cubic box-like configuration having a door 109 in the front wall thereof. The front wall is provided with a control panel having various indicators and switches, which are a switch 112 corresponding with the main switch 22 for applying commercial power to the microwave oven, an indicator 113 corresponding with the lamp 29 which is illuminated when the switch 112 is turned on, a push button switch 110 corresponding with the switch 23 for starting the magnetron to produce the microwaves, and an indicator 111 corresponding with the photo-diode 27 which is lighted during the period when the magnetron is running. Further provided on the control panel are a timer 114 corresponding with the timer motor 26 and a power volume 115 corresponding with the potentiometer 61. An elongated opening 116 is provided for displaying a time table showing preferable cooking times for various cooking operations.

According to the power supplier for the magnetron of the present invention, the power applied to the magnetron is controlled so that it is in a stable condition in spite of undesirable fluctuation in the commercial power source.

Since the transformer employed in the power source is smaller in size than heretofore, the apparatuses having a magnetron, such as microwave oven, can be made compact in size in comparison with the conventional types, and yet the manufacturing cost thereof can be reduced, due to the reduction of metallic material necessary for the transformer.

Furthermore, since the control system is operated by the current level, it is possible to further provide a central processing unit (CPU) in the power supplier, which CPU is available for controlling the power in various diversions.

Furthermore, since the switches for turning the magnetron on and off do not receive a large amount of current, it is possible to make such switches at a low cost, the manufacturing cost thus being advantageously reduced.

Although the present invention has been fully described by way of examples with reference to the accompanying drawings, it is to be noted that various changes and modifications will be apparent to those skilled in the art. Therefore, unless otherwise such changes and modifications depart from the scope of the present invention, they should be construed as included therein.

What is claimed is:

1. A power supplier which converts A.C. power supplied from a commercial A.C. power source to high voltage D.C. power to be supplied to a magnetron, comprising:
    (a) a switch means for connecting said power supplier to said commercial A.C. power source;
    (b) a first rectifying means connected to said switch means for producing a D.C. voltage from said commercial A.C. power source;
    (c) a resonance circuit having an inductive element and a capacitive element connected in series;
    (d) at least one thyristor switching circuit connected in series with said resonance circuit and further connected to said first rectifying means, for providing said D.C. voltage to said resonance circuit when triggered;
    (e) a trigger circuit connected to said thyristor switching circuit for triggering said thyristor switching circuit and causing said thyristor switching circuit to conduct;
    (f) a step-up transformer having the primary winding serving as the main part of said inductive element in said resonance circuit, at least one secondary winding generating high voltage energy and a non-saturable core; and
    (g) a second rectifying means connected to said secondary winding of said step-up transformer for producing a D.C. voltage to supply the magnetron.

2. A power supplier for a magnetron as claim in claim 1, wherein said primary and secondary windings of said step-up transformer are coupled with a coupling coefficient K having a value not larger than 0.8.

3. A power supplier for magnetron as claimed in claim 2, wherein said coupling coefficient K is not smaller than 0.4.

4. A power supplier for a magnetron as claimed in claim 1, further comprising a rectifying means connected between said secondary winding of the step-up transformer and said magnetron, said rectifying means comprising a first diode and a first capacitor connected in series which are coupled to said secondary winding, and a second diode and a second capacitor connected in series which are coupled to said secondary winding, said first and second diodes being directed in opposite directions to each other, and said magnetron being connected between;
    (a) a lead line means connecting said first diode and said first capacitor; and
    (b) a lead line means connecting said second diode and said second capacitor.

5. A power supplier for a magnetron as claimed in claim 1, further comprising a subsidiary winding at the secondary side of said step-up transformer and a capacitor coupled to said subsidiary winding, said subsidiary winding being connected to the cathode of said magnetron for heating said magnetron.

6. A power supplier for a magnetron as claimed in claim 1, wherein said step-up transformer has a design to satisfy the equation;

$$2\pi f_0 \cdot L_1 = R_e/n^2$$

wherein $f_0$ is the maximum operating frequency, $L_1$ is the self-inductance of said primary winding, $R_e$ is the effective resistance to said magnetron and $n$ is the ratio of turns of windings in said secondary winding to those of the primary winding.

7. A power supplier for a magnetron as claimed in claim 1, wherein said trigger circuit means comprises;
    (a) an adjustable reference circuit including a capacitor for producing across said capacitor a reference signal having a preadjusted value;
    (b) an oscillator circuit coupled to said reference circuit for producing said pulse signal upon receipt of said reference signal, said pulse signal having a frequency proportional to the magnitude of said reference signal; and
    (c) a switching circuit coupled to said capacitor in said adjustable reference circuit, said switching circuit connecting when said magnetron is not to be operated, opposite ends of said capacitor to discharge the same thereby ending said reference signal across capacitor and preventing said oscillator circuit from producing said pulse signal, and said switching circuit disconnecting when said magnetron is to be operated, opposite ends of said capacitor to charge the same thereby establishing said reference signal across said capacitor and operating said oscillator circuit to produce said pulse signal, the frequency of said pulse signal gradually increasing during said establishment of said reference signal, whereby said converted A.C. power gradually increases in an initial stage to protect said magnetron from a sudden change in the input power thereto.

8. A power supplier for a magnetron as claimed in claim 7, wherein said trigger circuit means further comprises a protecting circuit connected to said capacitor in said adjustable reference circuit for detecting the power of said A.C. power from the source for connecting opposite ends of said capacitor when said A.C. power decreases below a predetermined level, thereby protecting the magnetron from inadequate A.C. power.

9. A power supplier for a magnetron as claimed in claim 7, wherein said trigger circuit means further comprises;

(a) at least one signal generating means for generating a power signal having a value proportional to the valueof said converted A.C. power supplied to said magnetron; and
(b) a comparator circuit coupled to said signal generating means and connected between said adjustable reference circuit and said oscillator circuit for comparing said reference signal with said power signal and for generating a control signal which regulates the frequency of said pulse signal for decreasing the frequency of said pulse signal when said control signal becomes larger than a predetermined value determined by said adjustable reference circuit, and increasing said frequency when said control signal becomes smaller than said predetermined value, thereby stabilizing the input power to the magnetron.

10. A power supplier for magnetron as claimed in claim 9, wherein said signal generating means is a current transformer coupled to said resonant circuit.

11. A power supplier for a magnetron as claimed in claim 9, wherein said signal generating means is a first current transformer coupled to said resonant circuit and a second current transformer coupled between said switch means and said first rectifying means.

* * * * *